(12) United States Patent
Reber et al.

(10) Patent No.: US 8,694,926 B2
(45) Date of Patent: Apr. 8, 2014

(54) TECHNIQUES FOR CHECKING COMPUTER-AIDED DESIGN LAYERS OF A DEVICE TO REDUCE THE OCCURRENCE OF MISSING DECK RULES

(75) Inventors: Douglas M Reber, Austin, TX (US); Mehul D. Shroff, Austin, TX (US); Edward O Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/484,022

(22) Filed: May 30, 2012

(65) Prior Publication Data

US 2013/0326446 A1 Dec. 5, 2013

(51) Int. Cl.
*G06F 17/50* (2006.01)

(52) U.S. Cl.
USPC ............................................. 716/50; 716/110

(58) Field of Classification Search
USPC ........................... 716/100, 50, 110
See application file for complete search history.

(56) References Cited

U.S. PATENT DOCUMENTS

| | | | |
|---|---|---|---|
| 6,681,376 B1 | 1/2004 | Balasinski et al. | |
| 7,322,018 B2 * | 1/2008 | Rast et al. | 716/52 |
| 7,480,878 B2 | 1/2009 | Holesovsky et al. | |
| 8,191,018 B1 * | 5/2012 | Molesa et al. | 716/55 |
| 2008/0120586 A1 * | 5/2008 | Hoerold | 716/9 |
| 2012/0047479 A1 * | 2/2012 | Paris et al. | 716/112 |
| 2012/0297349 A1 * | 11/2012 | Do et al. | 716/52 |

* cited by examiner

*Primary Examiner* — Suchin Parihar
(74) *Attorney, Agent, or Firm* — Yudell Isidore Ng Russell PLLC

(57) ABSTRACT

A technique for computer-aided design layer checking of an integrated circuit design includes generating a representation of a device (e.g., a parameterized cell). Computer-aided design (CAD) layers are sequentially removed from the parameterized cell and a determination is made as to whether expected errors are detected or missed by an associated deck. The associated deck is then modified to detect the expected errors that are missed.

20 Claims, 4 Drawing Sheets

US 8,694,926 B2

TECHNIQUES FOR CHECKING COMPUTER-AIDED DESIGN LAYERS OF A DEVICE TO REDUCE THE OCCURRENCE OF MISSING DECK RULES

BACKGROUND

1. Field

This disclosure relates generally to integrated circuits and, more specifically, techniques for checking computer-aided design layers of an integrated circuit device to reduce the occurrence of missing rules in an electronic design automation software deck.

2. Related Art

Designers have employed layout versus schematic (LVS), methodology rule check (MRC), and design rule check (DRC) software (among other electronic design automation (EDA) software) in combination in an attempt to ensure an integrated circuit device (device) layout is correct. In general, MRC has employed a set of rules that attempt to ensure that standard cells are constructed properly. In some cases, MRC may implement rules (that are similar to DRC rules of a DRC deck) that apply to small technology blocks that for various reasons are not included in DRC rules.

Design rules usually include a series of parameters that allow a designer to verify the correctness of a mask set (i.e., a series of electronic data that define geometry for photolithography steps of semiconductor fabrication). In general, design rules are specific to a particular semiconductor manufacturing process. Typically, a design rule set specifies certain geometric and connectivity restrictions to ensure sufficient margins to account for variability in semiconductor manufacturing processes, so as to ensure that devices, when fabricated, function correctly. The most basic design rules are single layer rules, which may include a width rule that specifies a minimum width of any shape in the design and a spacing rule that specifies a minimum distance between two adjacent objects. More complex design rules include multiple layer rules. As another example, a two layer rule may specify a relationship that must exist between two layers. For example, an enclosure rule might specify that an object of one type, such as a contact or via, must be covered with some additional margin by a metal layer. A set of rules for a particular process has typically been referred to as a run-set, a rule deck, or a deck.

In general, a successful DRC ensures that a layout conforms to rules required for faultless fabrication. However, a successful DRC does not guarantee that a layout actually represents a circuit that is supposed to be fabricated. LVS software is usually employed to determine whether a particular integrated circuit layout corresponds to an original schematic or circuit diagram of a design. Early LVS programs operated mainly on the level of graph isomorphism, checking whether a schematic and layout were identical. With the advent of digital logic, isomorphism was too restrictive as the same function could be implemented in many different and non-isomorphic ways. As such, more recent LVS software has been augmented by formal equivalence checking, which checks whether two circuits perform the exact same function without demanding isomorphism. LVS checking software recognizes drawn shapes of a layout that represent electrical components of a circuit, as well as the connections between the electrical components. Connectivity (represented in a netlist) is compared by the LVS software against a schematic or circuit diagram netlist.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

Figure 1:
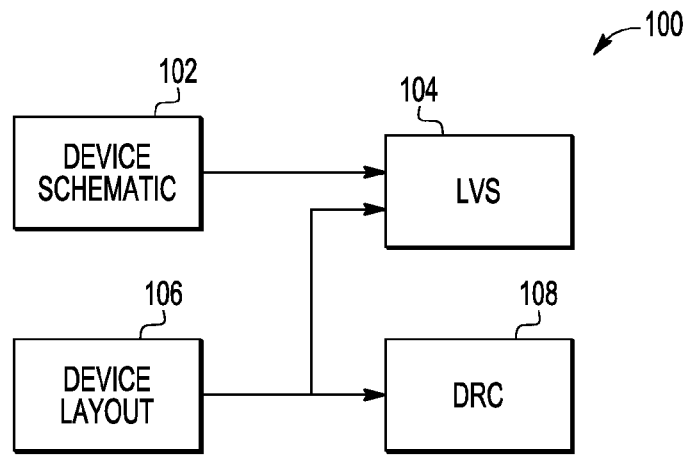
FIG. 1 is a diagram of a conventional approach for verifying an integrated circuit design using layout versus schematic (LVS) and design rule check (DRC) software.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims and their equivalents.

As used herein, a parameterized cell (p-cell) is a cell that is automatically generated by electronic design automation (EDA) software based on a value or values of governing parameters for the p-cell. That is, a p-cell represents a part or a component of a circuit that is dependent on one or more parameters (i.e., a p-cell is not fixed). For example, different instances of a single p-cell can represent transistors of different sizes, but otherwise similar characteristics. By using p-cells, a circuit designer can readily generate a large number of structures that only differ in a few parameters, thus increasing design productivity and consistency. As may be used herein, the term 'coupled' includes a direct electrical connection between elements or components and an indirect electrical connection between elements or components achieved using one or more intervening elements or components.

It should be appreciated that employing a combination of layout versus schematic (LVS), methodology rule check (MRC), and design rule check (DRC) methodologies (among other electronic design automation (EDA) software) may not provide a rigorous check of an integrated circuit design. That is LVS, MRC, and DRC methodologies are only as comprehensive as expected complex interactions are coded. In general, LVS, MRC, and DRC methodologies may erroneously assume coders and design rule manual (DRM) writers can accurately anticipate all layer combinations.

The disclosed techniques may be employed across multiple technologies to ensure that rules to prevent unwanted layer/device interactions have not been missed. As one example, assumptions that a marker (e.g., MKR;sdi) placed on an electrostatic discharge (ESD) partially salicided field-effect transistor (FET) was reserved for ESD devices has resulted in devices erroneously being identified as emitters. As another example, pads (e.g., PAC50 probe pads) have been recognized as microprobes when a probe pad marker (e.g., MKR;tp) did not abut a wirebond marker (e.g., MKR;wb). As yet another example, removal and re-insertion of radio frequency (RF) related devices (e.g., inductors and varactors) that have specialized density and metal width rules requires substantial reevaluation of existing base metal and metal density rules, as well as creating opportunities for missing inductor markers (e.g., MKR;IND) and RF device markers (e.g., MKR;rf and MKR;rfdmy). As yet another example, ESD resistors that are adjacent transistors and on a same active layer have not been correctly identified. In general, Open Artwork System Interchange Standard (OASIS) layer lists may include tens of thousands of layers, which makes ad hoc postulating of detrimental layer interactions extremely error-prone.

According to one aspect of the present disclosure, each supported device is generated using a p-cell (or similar standardized cell technique) and layers are sequentially removed from each device and expected deck errors and missing deck errors are assessed. The results are then reviewed and the rule set and deck functionality are adjusted (if necessary) to ensure that the correspondence between expected device recognition and restrictions are consistent.

According to another aspect of the present disclosure, layers from a layer list are added to a p-cell of a supported device and a determination is made as to whether an appropriate error was generated. In general, layers specified in a layer list are based on definitions in a device list and a design rule manual. Typically, a layer list includes all of the layers necessary to make all functions of a process design kit functional. In the event an error is not generated in response to adding a layer that should have caused error generation, an appropriate modification is made to an associated deck (e.g., a DRC deck or an LVS deck is modified such that an error is detected when the layer is added). It should be appreciated that an added layer may provide a full covering or a partial covering of a p-cell. According to another aspect of the present disclosure, a review process may be simplified by binning layers from a layer list into "care" and "don't care" bins.

Additionally, spatial checks may be implemented to detect conditions that play no direct role in device operation or recognition (e.g., maintaining tile exclusion zones and encroachment from other layers (e.g., stressors and/or wells)). Moreover, the techniques disclosed herein may be combined with a set of derived layer checks (e.g., post-Boolean layer operations resulting layer or post-CAD2MASK).

According to the present disclosure, DRC/LVS/MRC methodology shortcomings may be exposed by sequentially adding CAD layers from a layer list to a p-cell of a device and/or sequentially removing CAD layers from a p-cell of a device. In this manner, device formation issues and errors may be obviated or reduced up-front before a design is fabricated. In general, the disclosed techniques reduce errors attributable to unintentional oversight in defining devices and rules by forcing designers to more fully consider rule deficiencies. The techniques disclosed herein may be readily implemented by modifying DRC, LVS, and/or MRC codes to produce a results matrix. It is contemplated that a layout parasitic extraction (LPE) portion of LVS software may be employed to determine where coded proximity arrangements cause unanticipated device targeting.

With reference to FIG. 1, a conventional process for checking an integrated circuit (IC) design (or a portion of an IC design) is illustrated. As is shown in FIG. 1, electronic files that represent a device schematic 102 and device layout 106 are input into LVS software 104. The device layout 106 is also input into DRC software 108. The LVS software 104 recognizes drawn shapes of a layout that represent electrical components of an integrated circuit and connections between the electrical components. The DRC software 108 is designed to ensure that a layout conforms to rules required for faultless fabrication. However, in the event that associated rules for the LVS software 104 and/or the DRC software 108 are not comprehensive, layer/device conflicts that should be detected and flagged may go undetected.

Figure 2:
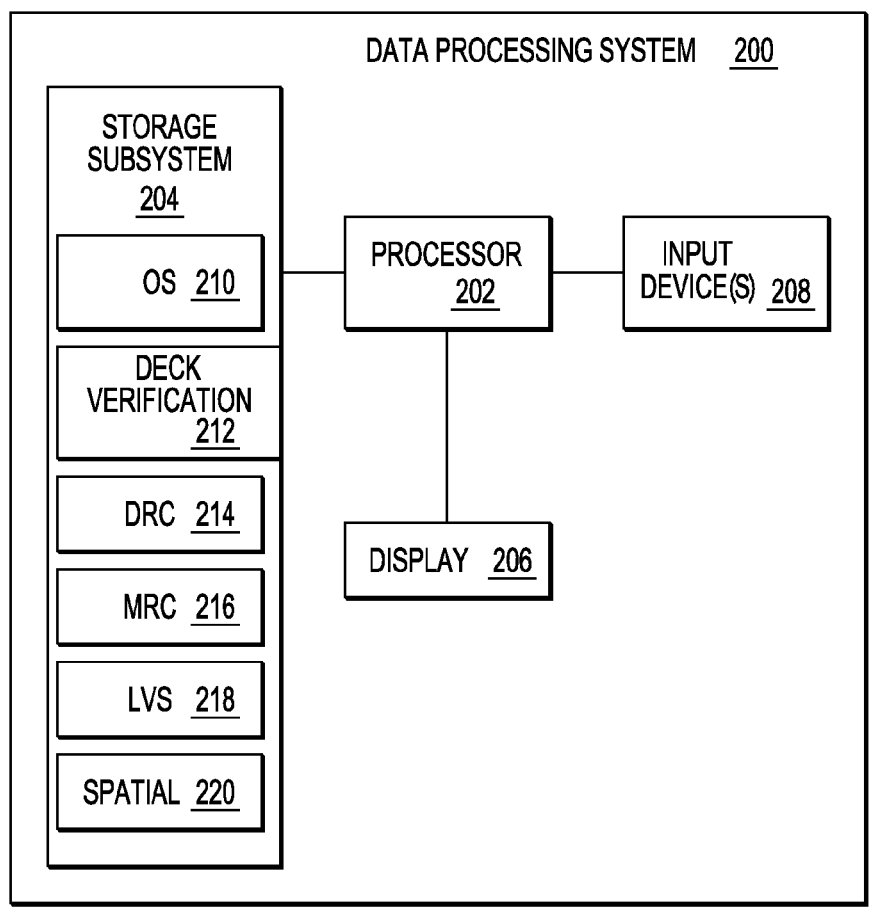
FIG. 2 is a diagram of a relevant portion of an exemplary data processing system that employs addition and/or removal of computer-aided design (CAD) layers to expose deck deficiencies for a device according to an embodiment of the present invention.

With reference to FIG. 2, an example data processing system 200 is illustrated that is configured to execute various electronic design automation (EDA) software operations. The system 200 may take various forms, such as one or more workstations, laptop computer systems, notebook computer systems, or desktop computer systems. The system 200 includes a processor 202 (which may include one or more processor cores for executing program code) coupled to a data storage subsystem 204, a display 206, and one or more input devices 208. The data storage subsystem 204 may include, for example, an application appropriate amount of volatile memory (e.g., dynamic random access memory (DRAM)), non-volatile memory (e.g., flash, read-only memory (ROM), or static RAM), and/or non-volatile mass storage devices, such as magnetic or optical disk drives. As is illustrated, the data storage subsystem 204 includes an operating system (OS) 210, as well as application programs, such as deck verification software 212, DRC software 214, MRC software 216, LVS software 218, and spatial software 220. According to the present disclosure, deck verification software 212, when executed, adds CAD layers to and/or removes CAD layers from a designated p-cell (or other standardized cell). Display 206 may be, for example, a cathode ray tube (CRT) or a liquid crystal display (LCD) monitor. Input device(s) 208 may include, for example, a mouse, a keyboard, haptic devices, and/or a touch screen.

Figure 3:
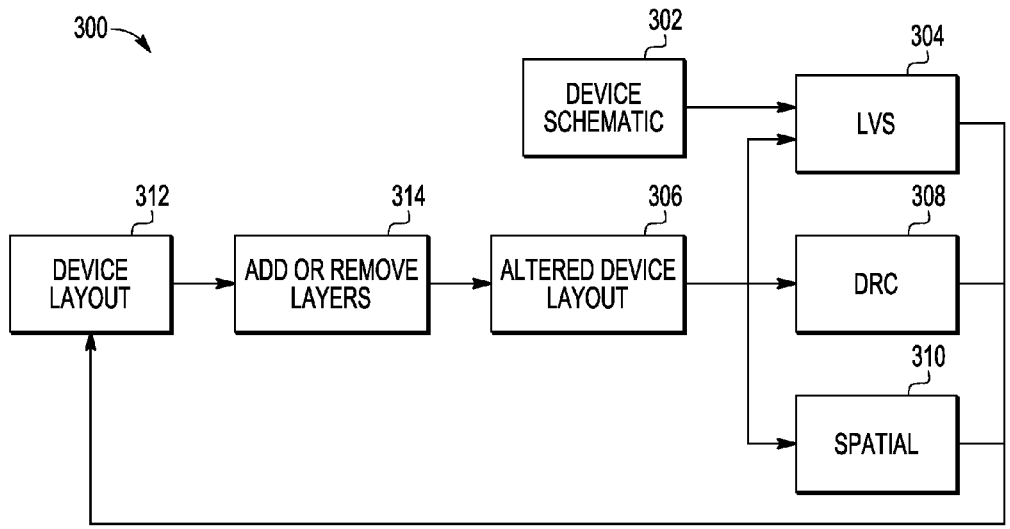
FIG. 3 is a diagram of a technique for verifying a circuit design using LVS and DRC according to one or more embodiments of the present invention.

With reference to FIG. 3, a deck verification process 300, for checking deck rules associated with various EDA software according to the present disclosure, is illustrated. The deck verification process 300 may be implemented by deck verification software 212 executing on the data processing system 200. As is shown in FIG. 3, electronic files that represent a device schematic 302 and an altered device layout 306 are input into LVS software 304. The altered device layout 306 is also input into DRC software 308 and may, optionally, be input into spatial software 310. The LVS software 304 recognizes drawn shapes of a layout that represent electrical components of an integrated circuit and connections between the electrical components. The DRC software 308 is designed to ensure that a layout conforms to rules required for faultless fabrication. As noted above, in the event that associated rules for the LVS software 304 and/or the DRC software 308 are not comprehensive, layer/device conflicts that should be detected and flagged may go undetected. According to the present disclosure, the altered device layout 306 is derived from a device layout 312 by adding CAD layers to and/or removing CAD layers 314 from the device layout 312.

According to one or more aspects of the present disclosure, when a device has a layer added that is not part of a defined p-cell/device, the device is run through DRC, LVS, and other optional decks for all layers (or at least layers that are not "don't care" layers) in a layer list. According to one or more other aspects of the present disclosure, when a subject device has a layer deleted from a defined p-cell/device, the device is also run through DRC, LVS, and other optional decks for all layers (or at least layers that are not "don't care" layers) in the original p-cell/device. A designer may then create a table highlighting which layers from the layer list should create an error or modified devices can be run through a derived layer check methodology flow to determine mask shape and interaction problems. If the results do not show errors for layers expected to have errors, the lack of prohibition in an associated deck or decks is captured and rules of the decks are updated as necessary to cause the errors to be detected during subsequent runs of the deck or decks.

As one example, a resistor marker (e.g., MKR;RH) was also incorrectly used to block lightly-doped drain (LDD) implants and resist protection oxide (RPO) (i.e., a self-aligned silicide (salicide) block) in an active oxide diffusion (OD) resistor. In this case when a designer wanted an ESD resistor and the marker MKR;RH was deleted, DRC and LVS did not detect the error. To address the lack of error detection, a designer may create a layer table that specifies that removing the marker MKR;RH should result in an error. As another example, when a new marker layer was added to prevent LDD implants (e.g., MKR;NOLDD) and DRC booleans were using device markers to also prevent implants (i.e., MKR;RH), it was later found that rules did not exist to prevent a MKR;NOLDD layer shape from interacting with devices, such as metal-oxide semiconductor field-effect transistors (MOSFETs) that required LDDs. Moreover, subsequent derived layer checking should have uncovered that the MOSFETs were not receiving LDD implants. To address the problem of a deck not detecting the MKR;NOLDD layer being added to a MOSFET, a designer may create a table detailing that a MOSFET should not be interacting with MKR;NOLDD layers. For example, additional MKR;NOLDD rules may be added in the DRC and/or LVS device recognition by adding a "NOT MKR;NOLDD" term.

As a another example, new fully-unsalicided MOSFETs were added with MKR;sdi present as the ESD device recognition marker. However, the marker MKR;sdi was also being used to identify emitters for latch-up checks. The improper marker choice of MKR;sdi necessitated that the ESD fully-unsalicided MOSFETs were also inadvertently always considered emitters. When the marker MKR;sdi was removed from the device the errors went away and LVS software no longer recognized the device as an ESD unsalidicided MOSFET. To address this problem, device marker strategy was changed to prevent dual-purpose markers.

Figure 4:
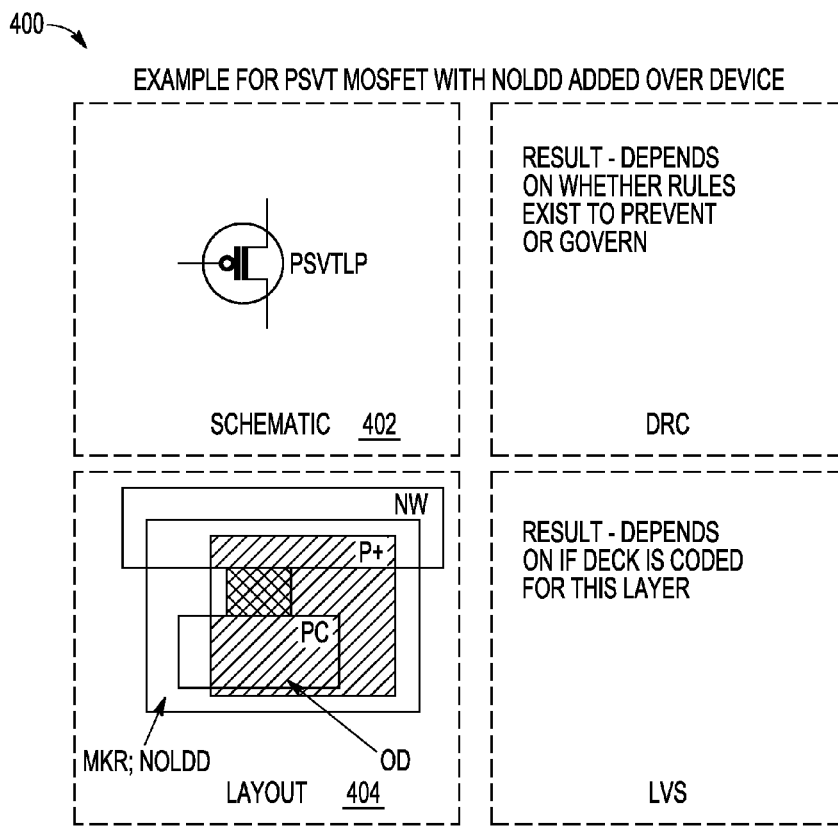
FIG. 4 is a diagram of an example device with a no lightly-doped diffusion (NOLDD) layer added to the device.

With reference to FIG. 4, a diagram 400 depicts a schematic 402 and a layout 404 for a p-channel standard threshold voltage low-power MOSFET (psvtlp). The layout 404 for the psvtlp is illustrated with a MKR;NOLDD layer added to a p-cell for the psvtlp. A DRC software result depends on whether a DRC deck includes one or more rules to detect a MKR;NOLDD layer that is overlaid on the p-cell for the psvtlp. Similarly, an LVS software result depends on whether an LVS deck includes one or more rules to detect a MKR;NOLDD layer that is overlaid on the p-cell for the psvtlp. According to the present disclosure, if no failure is discovered by the DRC or LVS software and the device is recognized, rules in the DRC and LVS decks are modified to detect when a MKR;NOLDD layer is overlaid on a p-cell for a psvtlp.

Figure 5:
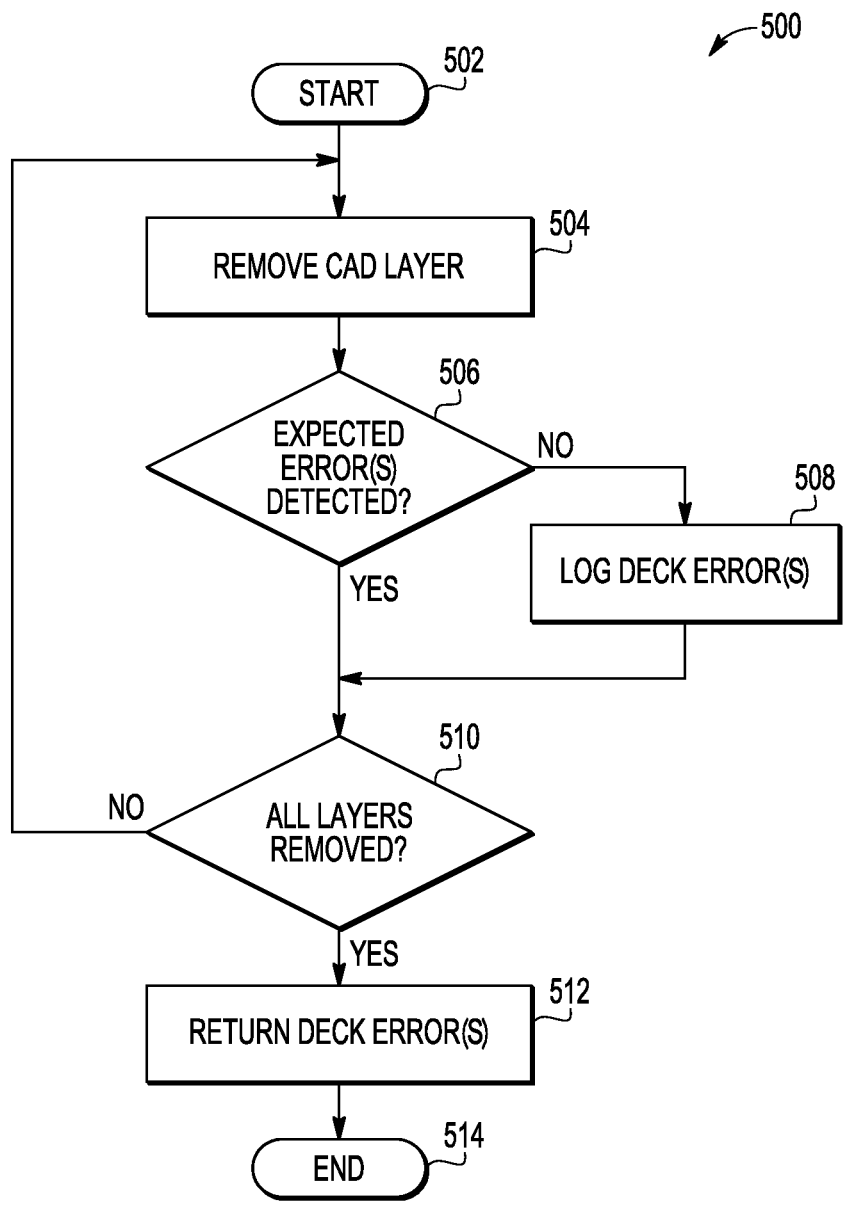
FIG. 5 is a flowchart for an exemplary process that removes CAD layers from a device according to an embodiment of the present invention.

With reference to FIG. 5, a deck updating process 500 is illustrated that determines whether rules of a deck are current by removing CAD layers from a device (e.g., represented by a p-cell). It should be appreciated that a device may be represented using any form of standardized layout. The process 500 may be, for example, implemented by data processing system 200 executing deck verification software 212. The process 500 is initiated in block 502, at which point control transfers to block 504. In block 504, the system 200 begins removing CAD layers from the device. Next, in decision block 506, the system 200 determines whether an expected error (or errors) is detected by an appropriate deck (e.g., a physical DRC deck and/or an LVS deck). In response to an expected error (or errors) not being detected in block 506, control transfers to block 508 where a deck error is logged. From block 508, control transfers to decision block 510.

In response to an expected error (or errors) being detected in block 506, control transfers to block 510. In block 510, the system 200 determines whether all layers have been removed from the device. In response to one or more layers remaining in block 510, control transfers to block 504 where a next layer is removed from the device. In response to no layers remaining in block 510, control transfers to block 512 where the logged errors are returned for further consideration and use in modifying appropriate decks to detect the logged errors. Following block 512, control returns to a calling routine in block 514. It should be appreciated that the process 500 may be executed following modification of the appropriate decks to ensure that rules of the decks have been properly modified to detect errors.

Figure 6:
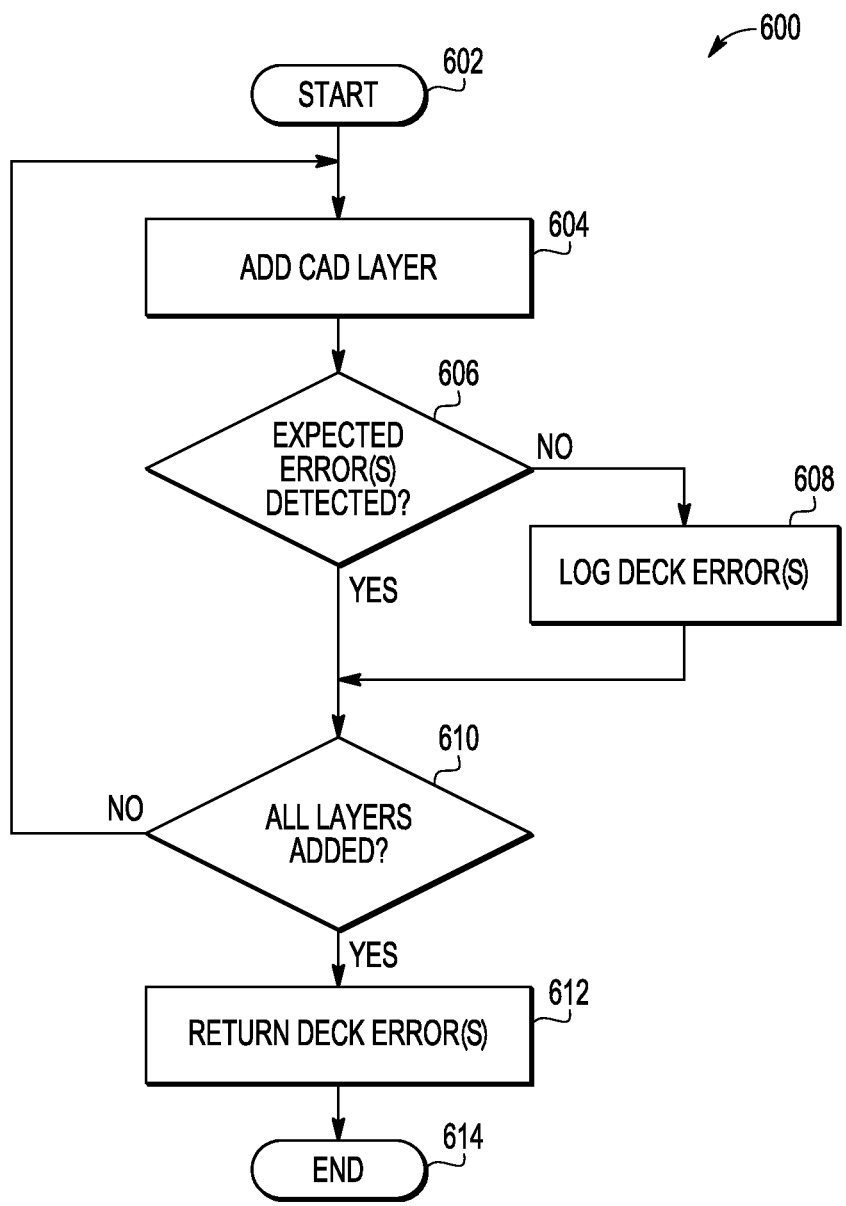
FIG. 6 is a flowchart for an exemplary process that adds CAD layers (from a layer list) to a device according to an embodiment of the present invention.

With reference to FIG. 6, a deck updating process 600 is illustrated that determines whether a deck is current by adding CAD layers to a device (e.g., represented by a p-cell). It should be appreciated that a device may be represented using any form of standardized layout. The process 600 may be implemented by data processing system 200 executing deck verification software 212. The process 600 is initiated in block 602, at which point control transfers to block 604. In block 604, the system 200 adds a CAD layer from a layer list to the device. Next, in decision block 606, the system 200 determines whether an expected error is detected by an appropriate deck (e.g., a physical DRC deck and/or an LVS deck). In response to an expected error (or errors) not being detected in block 606, control transfers to block 608 where a deck error is logged. From block 608, control transfers to decision block 610.

In response to an expected error (or errors) being detected in block 606, control transfers to block 610. In block 610, the system 200 determines whether all layers have been added to the device. In response to one or more layers remaining in block 610, control transfers to block 604 where a next layer is added to the device. In response to no layers remaining in block 610, control transfers to block 612 where the logged errors (if any) are returned for further consideration and use in modifying appropriate decks to detect the logged errors. Following block 612, control returns to a calling routine in block 614. It should also be appreciated that the process 600 may be executed following modification of the appropriate decks to ensure that rules of the decks have been properly modified.

As may be used herein, a software system can include one or more objects, agents, threads, subroutines, separate software applications, two or more lines of code or other suitable software structures operating in one or more separate software applications, on one or more different processors, or other suitable software architectures.

As will be appreciated, the processes in various embodiments of the present invention may be implemented using any combination of software, firmware or hardware. As a preparatory step to practicing the invention in software, code (whether software or firmware) according to a preferred embodiment will typically be stored in one or more machine readable storage mediums such as semiconductor memories such as read-only memories (ROMs), programmable ROMs (PROMs), etc., thereby making an article of manufacture in accordance with the invention. The article of manufacture containing the code is used by either executing the code directly from the storage device or by copying the code from the storage device into another storage device such as a random access memory (RAM), etc. An apparatus for practicing the techniques of the present disclosure could be one or more communication devices.

Although the invention is described herein with reference to specific embodiments, various modifications and changes can be made without departing from the scope of the present invention as set forth in the claims below. For example, the techniques disclosed herein are generally broadly applicable to systems that facilitate data communication. Accordingly, the specification and figures are to be regarded in an illustrative rather than a restrictive sense, and all such modifications are intended to be included with the scope of the present invention. Any benefits, advantages, or solution to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of computer-aided design layer checking of an integrated circuit design, comprising:
   generating, using a data processing system, a representation of a device;
   sequentially removing, using the data processing system, computer-aided design (CAD) layers from the representation of the device;
   determining, using the data processing system, in response to the removing, whether expected errors are detected or missed by an associated deck; and
   modifying, using the data processing system, the associated deck to detect the expected errors that are missed.

2. The method of claim 1, wherein the associated deck is a layout versus schematic deck.

3. The method of claim 1, wherein the associated deck is a physical design rule check deck.

4. The method of claim 1, wherein the associated deck is a methodology rule check deck.

5. The method of claim 1, wherein the associated deck includes a layout versus schematic deck, a physical design rule check deck, and a methodology rule check deck and the representation of the device corresponds to a parameterized cell.

6. A method of device layer checking, comprising:
   generating, using a data processing system, a representation of a device;
   sequentially adding, using the data processing system, computer-aided design (CAD) layers from a layer list to the representation of the device;
   determining, using the data processing system, in response to the adding, whether expected errors are detected or missed by an associated deck; and
   modifying, using the data processing system, the associated deck to detect the expected errors that are missed.

7. The method of claim 6, wherein the associated deck is a layout versus schematic deck.

8. The method of claim 6, wherein the associated deck is a physical design rule check deck.

9. The method of claim 6, wherein the associated deck is a methodology rule check deck.

10. The method of claim 6, wherein the associated deck includes a layout versus schematic deck, a physical design rule check deck, and a methodology rule check deck and the representation of the device is corresponds to a parameterized cell.

11. A data processing system for computer-aided design layer checking of an integrated circuit design, comprising:
    a storage system; and
    a processor coupled to the storage system, wherein the processor is configured to generate a representation of a device, sequentially remove computer-aided design (CAD) layers from the representation of the device, determine, in response to the removing, whether expected errors are detected or missed by an associated deck, and modify the associated deck to detect the expected errors that are missed.

12. The data processing system of claim 11, wherein the associated deck is a layout versus schematic deck.

13. The data processing system of claim 11, wherein the associated deck is a physical design rule check deck.

14. The data processing system of claim 11, wherein the associated deck is a methodology rule check deck.

15. The data processing system of claim 11, wherein the associated deck includes a layout versus schematic deck, a physical design rule check deck, and a methodology rule check deck and the representation of the device corresponds to a parameterized cell.

16. A data processing system for device layer checking, comprising:
    a storage system; and
    a processor coupled to the storage system, wherein the processor is configured to generate a representation of a device, sequentially add computer-aided design (CAD) layers from a layer list to the representation of the device, determine, in response to the adding, whether expected errors are detected or missed by an associated deck, and modify the associated deck to detect the expected errors that are missed.

17. The data processing system of claim 16, wherein the associated deck is a layout versus schematic deck.

18. The data processing system of claim 16, wherein the associated deck is a physical design rule check deck.

19. The data processing system of claim 16, wherein the associated deck is a methodology rule check deck.

20. The data processing system of claim 16, wherein the associated deck includes a layout versus schematic deck, a physical design rule check deck, and a methodology rule check deck and the representation of the device corresponds to a parameterized cell.

* * * * *